United States Patent
Patel

(10) Patent No.: US 12,400,858 B2
(45) Date of Patent: Aug. 26, 2025

(54) GREYSCALE LITHOGRAPHY TECHNIQUES FOR MANUFACTURING FIELD PLATES

(71) Applicant: Insyt, Inc., San Jose, CA (US)

(72) Inventor: Kedar Patel, San Jose, CA (US)

(73) Assignee: Insyt, Inc., San Jose, CA (US)

( * ) Notice: Subject to any disclaimer, the term of this patent is extended or adjusted under 35 U.S.C. 154(b) by 560 days.

(21) Appl. No.: 17/840,524

(22) Filed: Jun. 14, 2022

(65) Prior Publication Data
US 2022/0319840 A1    Oct. 6, 2022

Related U.S. Application Data

(63) Continuation-in-part of application No. 17/197,008, filed on Mar. 9, 2021, now Pat. No. 11,695,068.

(60) Provisional application No. 62/987,271, filed on Mar. 9, 2020.

(51) Int. Cl.
*H01L 21/027* (2006.01)
*H10D 64/00* (2025.01)
*H10D 64/23* (2025.01)

(52) U.S. Cl.
CPC ........ *H01L 21/0274* (2013.01); *H10D 64/111* (2025.01); *H10D 64/256* (2025.01)

(58) Field of Classification Search
CPC .. H10D 64/111; H01L 21/0274; H01L 29/402
See application file for complete search history.

(56) References Cited

U.S. PATENT DOCUMENTS

| | | | |
|---|---|---|---|
| 7,692,263 B2 | 4/2010 | Wu et al. | |
| 8,237,198 B2* | 8/2012 | Wu | H10D 84/811 |
| | | | 257/199 |
| 8,530,978 B1* | 9/2013 | Chu | H01L 29/7786 |
| | | | 257/192 |
| 9,831,315 B2 | 11/2017 | Chu et al. | |
| 10,050,136 B2 | 8/2018 | Iucolano | |
| 2011/0140172 A1* | 6/2011 | Chu | H01L 29/4175 |
| | | | 438/106 |
| 2014/0001557 A1* | 1/2014 | Mishra | H01L 29/207 |
| | | | 257/E21.409 |
| 2014/0061659 A1* | 3/2014 | Teplik | H01L 29/7786 |
| | | | 257/E21.403 |

(Continued)

OTHER PUBLICATIONS

Coffie, "Slant Field Plate Model for Field-Effect Transistors," *IEEE Transactions on Electron Devices*, 61(8), Aug. 2014. (6 pages).

(Continued)

*Primary Examiner* — Joseph C. Nicely
(74) *Attorney, Agent, or Firm* — Newport IP, LLC; Tyler Thorp

(57) ABSTRACT

Methods for efficiently manufacturing field plates with one or more sloped profiles are described. The fabrication of a field plate structure may include the application of greyscale lithography techniques to enable the concurrent formation of one or more sloped surfaces of the field plate structure during one or more common processing steps. A technical benefit of manufacturing field plate structures that have one or more sloped surfaces using greyscale lithography is that fabrication costs may be substantially reduced by reducing the number of process steps required to form the field plate structures.

11 Claims, 20 Drawing Sheets

(56) References Cited

U.S. PATENT DOCUMENTS

2017/0170284 A1* 6/2017 Li .................. H10D 64/111

OTHER PUBLICATIONS

Wong, "Novel Asymmetric Slant Field Plate Technology for High-Speed Low-Dynamic $R_{on}$ E/D-mode GaN HEMTs," *IEEE Electron Device Letters*, 38(1), Jan. 2017. (4 pages).

* cited by examiner

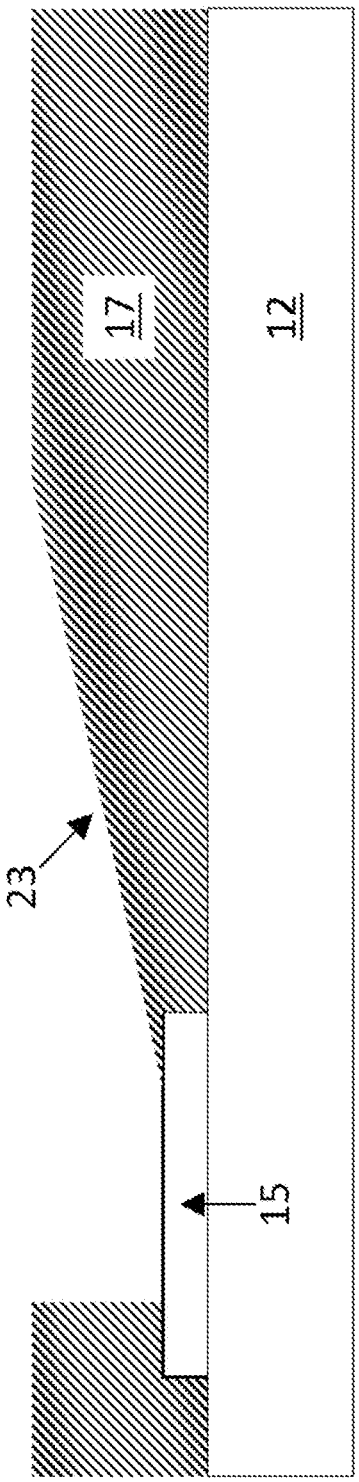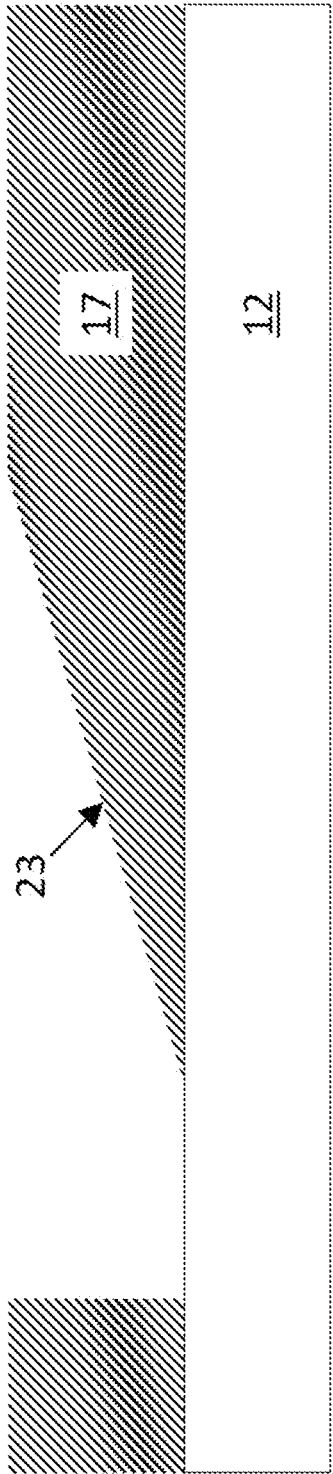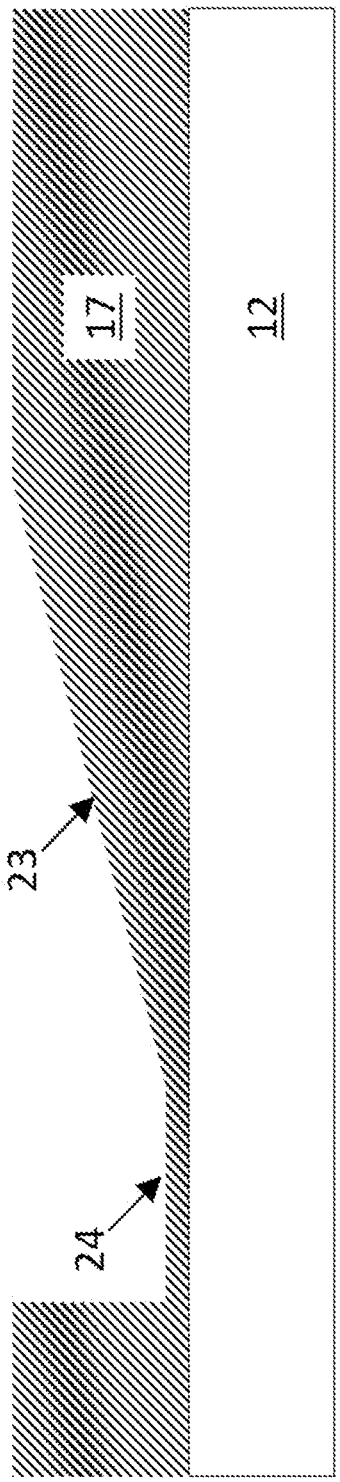
FIG. 4A
FIG. 4B
FIG. 4C

US 12,400,858 B2

GREYSCALE LITHOGRAPHY TECHNIQUES FOR MANUFACTURING FIELD PLATES

CLAIM OF PRIORITY

The present application is a continuation-in-part of U.S. patent application Ser. No. 17/197,008, entitled "Greyscale Lithography for Double-Slanted Gate Connected Field Plate," filed Mar. 9, 2021, which claims priority to U.S. Provisional Application No. 62/987,271, entitled "Greyscale Lithography for Double-Slanted Gate Connected Field Plate," filed Mar. 9, 2020, which are herein incorporated by reference in their entirety.

BACKGROUND

Fabrication of an integrated circuit or a semiconductor device typically requires various physical and chemical processes to be performed on layers formed above a semiconductor substrate (e.g., a silicon substrate). These processes include film deposition, patterning, semiconductor doping, and etching. Fundamental to many of these processes is the use of photolithography, in which a pattern may be transferred from a photolithographic mask onto a substrate or deposited film.

BRIEF SUMMARY

Systems and methods for fabricating field plate structures are provided. In some embodiments, a field plate structure may be fabricated using greyscale lithography techniques to enable the concurrent formation of one or more sloped surfaces of the field plate structure during a common processing step (e.g., the formation of two different sloped surfaces for the field plate structure during an etch processing step). The field plate structure may be electrically or directly connected to a terminal of a transistor. In one example, the field plate structure may comprise a double-slanted gate connected field plate that is electrically connected to a gate terminal of a transistor and during fabrication a source-side slope and a drain-side slope of the double-slanted gate connected field plate may be concurrently formed with two different slopes or two different step profiles. According to some embodiments, the technical benefits of the disclosed systems and methods for fabricating field plate structures include a reduction in the number of process steps required to form the field plate structures and a reduction in the manufacturing costs for fabricating the field plate structures.

BRIEF DESCRIPTION OF THE DRAWINGS

FIGS. 2, 3A, 3B, 4A, 4B, and 4C depict various cross-sectional views of a semiconductor device during fabrication.

DETAILED DESCRIPTION

Figure 1:
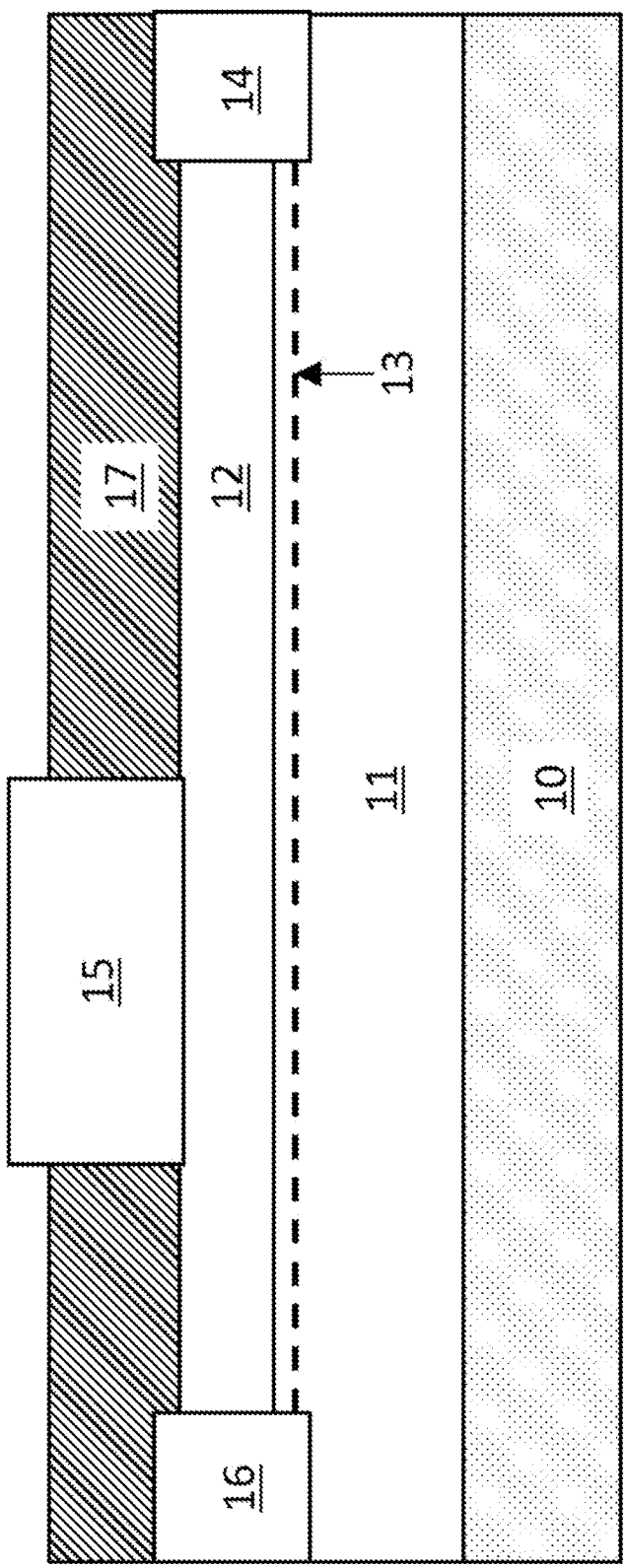
FIG. 1 depicts a cross-sectional view of one embodiment of a GaN HEMT.

Technology is described for efficiently fabricating field plate structures with one or more sloped profiles. The fabrication of a field plate structure may include the application of greyscale lithography techniques to simultaneously form one or more sloped surfaces of the field plate structure during a common processing step (e.g., forming two different sloped surfaces for the field plate structure during an etch processing step). The field plate structure may be formed to optimize electric field distributions between gate and drain terminals and/or gate and source terminals of a transistor, such as a gallium nitride (GaN) high electron mobility (HEMT) field effect transistor. In some cases, a HEMT device may also be referred to as a modulation doped field effect transistor (MODFET) or a two-dimensional electron-gas field effect transistor (TEGFET). The field plate structure may be connected to a terminal of a power transistor, such as a GaN power transistor, to enable high current and high voltage operations. The wider bandgap, higher breakdown field, and higher electron mobility of GaN typically allows GaN-based devices to operate with higher temperatures, voltages, and switching speeds compared with silicon-based devices.

In field effect transistors for power switching applications, the electric field distribution typically needs to be optimized between two terminals (e.g., the gate to drain terminals and/or gate to source terminals) when a high voltage is applied (e.g., a voltage greater than 200V). If the electric field distribution is not properly engineered, it may lead to device performance degradation (e.g., dynamic ON-resistance or current dispersion) or high leakage current that may cause premature breakdown. Slanted or sloped field plates may be used to reduce the peak electric field and/or to optimize the electric field distribution between two terminals of a field effect transistor. A slanted or sloped field plate may be connected to a gate terminal, a drain terminal, or a source terminal of the field effect transistor. In some cases, the gate terminal of a field effect transistor may be connected to a gate-connected field plate and/or the source terminal of the field effect transistor may be connected to a source-connected field plate.

For depletion mode transistors, the gate terminal may be set to the lowest or most negative voltage of the transistor terminals during operation. In this case, a gate-connected field plate with a first slope (e.g., comprising an increasing slope or a uniform slope) extending from the gate terminal towards the drain terminal may be provided such that the thickness of the dielectric under the field plate increases as the distance from the gate terminal towards the drain terminal increases. The gate-connected field plate may also have a second slope extending from the gate terminal towards the source terminal such that the thickness of the dielectric under the field plate increases as the distance from the gate terminal towards the source terminal increases. In some cases, the first slope may be less steep than the second slope. In other cases, the first slope may be steeper than the second slope.

For enhancement mode transistors, the source terminal may be set to the lowest voltage of the transistor terminals during operation. In this case, a source-connected field plate with a first slope (e.g., comprising an increasing slope or a uniform slope) that extends towards the drain terminal may be provided such that the thickness of the dielectric under the field plate increases as the field plate gets closer to the drain terminal. The thickness of the dielectric under the field plate may be maximum for a first portion of the field plate that is closest to the drain terminal and may be minimum for a second portion of the field plate that is closest to the source terminal. In some embodiments, both a source-connected field plate and a gate-connected field plate may be used with the same or different slopes. For example, a source-connected field plate connected to a source terminal of a transistor may have a first slope for a portion of the source-connected field plate that extends towards a drain terminal of the transistor and a gate-connected field plate connected to a gate terminal of the transistor may have a second slope for a portion of the gate-connected field plate that extends towards the drain terminal of the transistor. The first slope may be different from the second slope (e.g., the first slope may be steeper than the second slope).

Some technical benefits of utilizing greyscale lithography techniques to enable the concurrent formation of one or more sloped surfaces of one or more field plate structures associated with a transistor include a reduction in fabrication processing steps required to form the one or more field plate structures and the ability to efficiently manufacture field plate structures (e.g., double-slanted gate connected field plate structures) that may simultaneously optimize electric field distributions between gate and drain terminals and gate and source terminals of the transistor.

Both mask-based lithography and maskless lithography, in which UV radiation or a focused electron beam is used to write a desired image pattern into a layer of photoresist, typically use binary structures in which some areas of the layer of photoresist are opaque while other areas of the layer of photoresist have been removed and are fully exposed to allow for subsequent processing steps, such as etching. In contrast, greyscale lithography may refer to a technique in which a layer of photoresist is shaped (e.g., by controlling the degree to which different areas of the layer of photoresist are exposed to incident light energy) such that the structure height of the layer of photoresist is varied according to a desired image pattern. The resulting three-dimensional structure within the layer of photoresist may be transferred to an underlying substrate or layer of material using an etching technique, such as reactive-ion etching (RIE).

In the following description, various methods for fabricating field plates are provided with numerous details. Some details about the device structures may be omitted for better understanding of the present disclosure. For example, common processing steps (e.g., the formation of isolation regions or structures, various implant and annealing steps, planarization, the formation of interconnects, vias and contacts, formation of a passivation layer, or the surface cleaning steps) may be omitted in order to highlight the processing steps described.

FIG. 1 depicts one embodiment of a cross-sectional view of a GaN HEMT device. The HEMT device consists of a substrate layer 10 which can be silicon, sapphire, silicon carbide or any other material suitable for making III-Nitride (III-N) devices. Layers 11 and 12 are formed on top of or above substrate layer 10. Layer 11 may comprise a buffer layer (e.g., a layer of GaN) and layer 12 may comprise a barrier layer formed on the buffer layer. A layer may be formed on top of another layer using a deposition process such as chemical vapor deposition, physical vapor deposition, or atomic layer deposition. Layers 11 and 12 may comprise III-N materials of different compositions and each layer may comprise one or more sub-layers. A III-N material may comprise a binary material, such as AlN, InN, or GaN, or a ternary material, such as $Al_xGa_yN$ where x+y is about 1. In some cases, a AlGaN/GaN HEMT device may be include a AlGaN barrier layer formed above a GaN buffer layer.

The layers 11 and 12 may comprise doped or undoped layers of III-N materials. In one embodiment, layer 11 is GaN and layer 12 is $Al_xGa_yN$ where x+y is about 1. A two-dimensional electron gas (2DEG) channel 13 may be formed at the interface of layers 11 and 12 with the appropriate choice of layer 11 and 12 compositions. In another embodiment, layer 12 can be a stack of $Al_xGa_yN$ and a gate insulator on top of the $Al_xGa_yN$. Source electrode 16 and drain electrode 14 are formed such that some part of each electrode is in contact with the 2DEG channel 13. A gate electrode 15 is formed such that it is in contact with the layer 12. If used, a gate insulator (not depicted) arranged between the gate electrode 15 and the layer 12 may comprise SiN, SiON, AlSiON or any insulating film that is sufficient to prevent leakage current to flow between the gate electrode 15 and the drain electrode 14 through the passivation layer 17 and/or the 2DEG channel 13. The HEMT device may be designed to provide depletion-mode or enhancement-mode operation. Passivation layer 17 is formed above layer 12 and may comprise an insulating material, such as $Si_3N_4$, $SiO_2$, or AlN or any stack consisting of a combination of these materials. The passivation layer 17 may comprise a dielectric layer.

During fabrication of the device, layers 11 and 12 may be epitaxially grown on substrate layer 10. Metal-organic Chemical Vapor Deposition (MOCVD), Molecular Beam Epitaxy (MBE) process may be used for the epitaxial growth of the layers 11 and 12. Definition and sequence of the source electrode 16 and the drain electrode 14 may be performed before or after the formation of the gate electrode 15.

Figure 2:
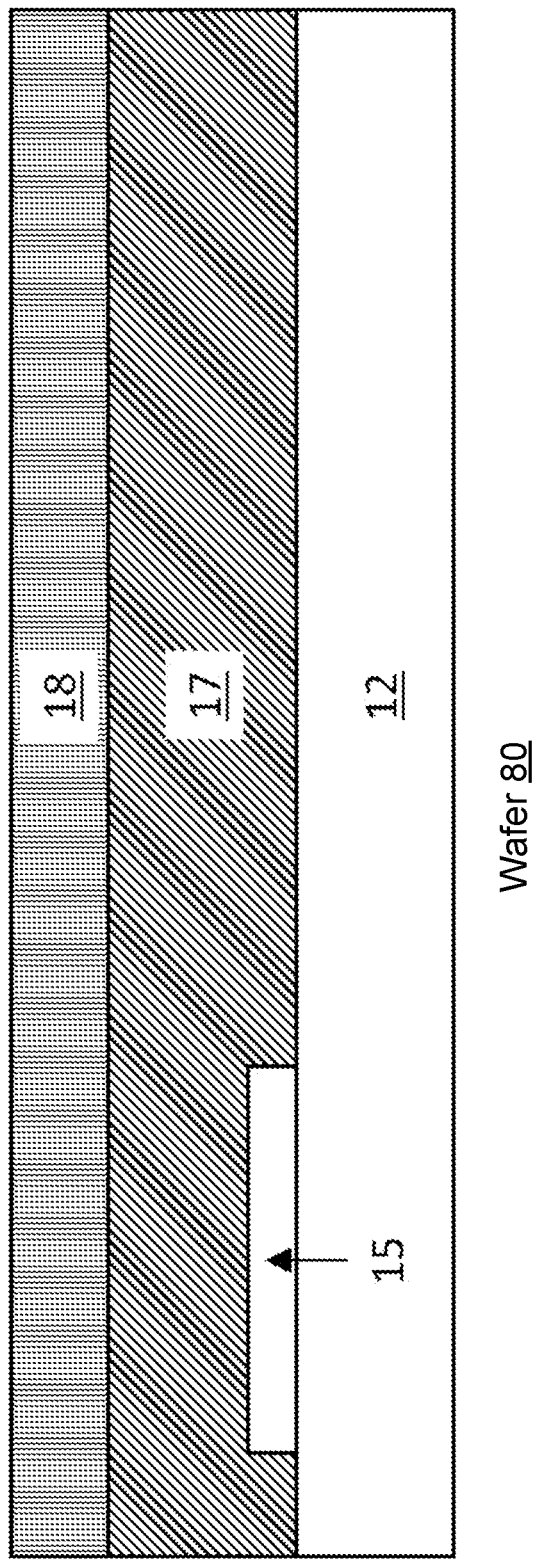

FIG. 2 depicts one embodiment of a cross-sectional view of a portion of a wafer 80 processed with passivation layer 17 deposited on top of layer 12. Passivation layer 17 may be deposited by Plasma-assisted Chemical Vapor Deposition (PECVD) process. In one embodiment, the gate electrode 15 or portion thereof, has been formed on top of layer 12 prior to passivation layer 17 being deposited on top of it. Gate electrode 15 may be formed using either a lift-off process or deposition and etch of gate electrode material. In another embodiment, gate electrode 15 designates the region where the gate electrode would be formed through subsequent processing. A photoresist layer 18 is spin coated on top of passivation layer 17. The photoresist layer 18 may be of positive or negative tone and furthermore, it may also be a stack of multiple layers comprising photosensitive and non-photosensitive materials, such as positive tone resist coated on top of lift-off resist.

Figure 3A:
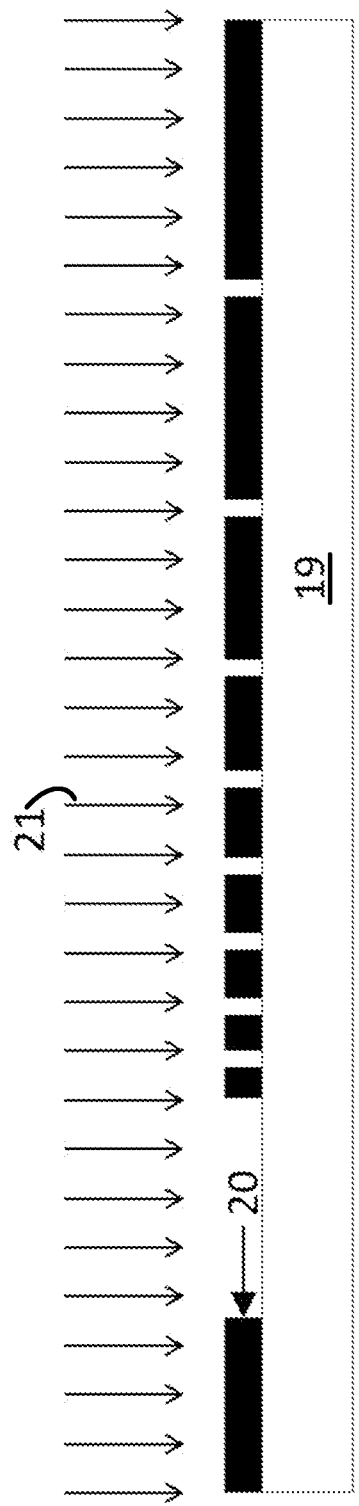

The wafer 80 (or portion thereof) may be exposed using a photomask with greyscale design (or a greyscale mask) as depicted in FIG. 3A. In the photomask depicted in FIG. 3A, design features are defined by etching away the chrome layer 20 located on the quartz 19 substrate. Openings in the chrome layer 20 allow light 21 to pass through and be projected onto the wafer 80 below. For positive photoresists, regions that are exposed to light are crosslinked and can be dissolved away using appropriate chemicals such as tetramethylammonium hydroxide (TMAH). Sub-resolution features may be defined on the photomask to allow a fraction of the light intensity to be transmitted through the photomask. Using an appropriate exposure dose and regulated opening in the chrome layer 20, the light intensity can be spatially modulated between 0% and 100% of the nominal exposure across the photomask. Photoresist exposed with such spatially modulated light intensity will crosslink different amounts of thickness from the top surface of the photoresist. Photoresist in regions with 100% light intensity will be fully crosslinked and dissolve away during a develop step by solvent. Photoresist with partial light intensity between 0% and 100% will crosslink at thickness depending on the photoresist contrast curve. In regions with 0% light intensity (or no light) full thickness of the photoresist will remain.

Figure 3B:
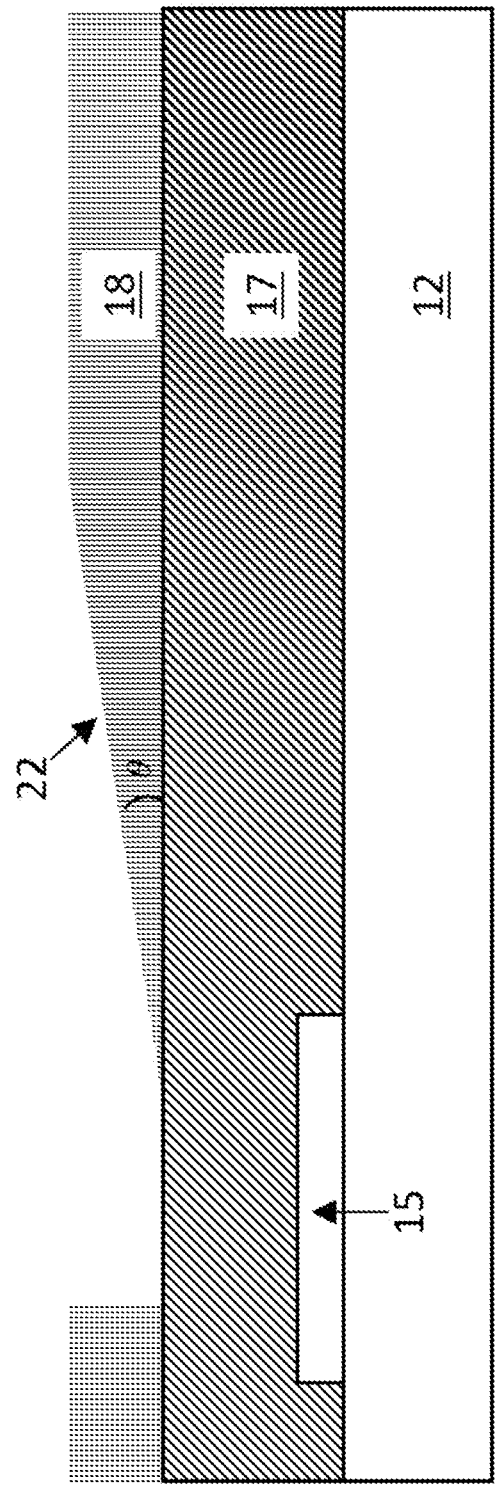

As depicted in FIG. 3B, the greyscale mask can be designed to create a uniformly slanted photoresist profile 22. The angle of the slant (8) is typically referenced from the bottom of the photoresist layer 18. A greater angle for the slope corresponds with a steeper slope. In some cases, subsequent to light exposure and develop steps, the slanted photoresist profile 22 may not be uniform as defects in photomask design and processing may lead to undesired variations in photoresist thickness. These defects may be healed, at least partially, by subjecting the wafer 80 with photoresist after the develop step to high temperature reflow anneal. An improved profile may be realized through the optimization of time and temperature of the reflow anneal.

FIG. 4A depicts one embodiment of a cross-sectional view of the layers depicted in FIG. 3B after the wafer 80 is subjected to dry or wet etch of the passivation layer 17. In one embodiment, the photoresist layer 18 is stripped off by solvents. In another embodiment, the photoresist layer 18 could also be used to deposit gate material by lift-off process. Dry etch can be performed via reactive-ion etching (RIE) or inductively coupled plasma (ICP) etching processes. In one embodiment, the gate electrode 15 may have been encapsulated by passivation layer 17 and in such case, the passivation layer 17 on top of the gate electrode 15 can be completely removed to expose the gate electrode 15. As depicted in FIG. 4A, the gate electrode 15 may be sized larger or wider than the opening in passivation layer 17. Dry etching may transfer the slanted photoresist profile 22 in photoresist layer 18 to the slant 23 in passivation layer 17. The angle of the slant 23 in passivation layer 17 may depend on the incoming photoresist angle and the etch selectivity of the photoresist to passivation layer material.

In another embodiment, the gate electrode 15 is not formed prior to the deposition of the passivation layer 17. The passivation layer 17 can be completely removed through dry or wet etch to expose some region of layer 12 as shown in FIG. 4B. Alternately, in another embodiment as shown in FIG. 4C, the passivation layer 17 may be partially removed through dry or wet etch to stop short of exposing layer 12 and have some residual material 24 remain. In one example, the etch could stop on a SiN or AlN etch stop layer which is part of the passivation layer 17. Following the passivation layer 17 etch, the field plate material (e.g., comprising a metal stack) can be deposited through a lift-off process.

Figure 5A:
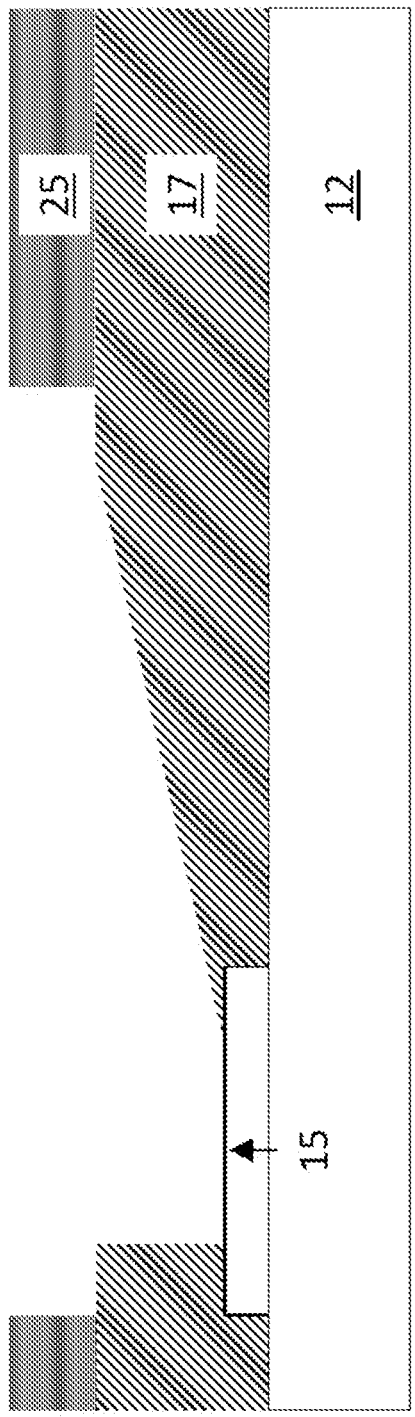
FIGS. 5A, 5B, 6, and 7 depict various cross-sectional views associated with semiconductor fabrication.

FIG. 5A depicts one embodiment of a cross-sectional view of the layers depicted in FIG. 4A after photoresist 25 has been spin coated, exposed and developed to define the region of the field plate using a dedicated and separate photomask from the one used to define and etch the passivation layer 17 in FIG. 3B. In another embodiment, photoresist 25 can be the same photoresist layer 18 that was used to etch passivation layer 17 in FIG. 3B. For lift-off process, the photoresist 25 can be multiple layers such as positive tone photoresist on top of lift-off resist (LOR).

Following the definition of the field plate pattern onto the wafer 80, field plate metal stack 26 may be deposited onto the wafer 80. Just prior to the metal deposition, prerequisite cleaning of the gate electrode interface 27 may be performed. In alternate embodiments, such as those shown in FIGS. 4B and 4C, the interface that needs to be cleaned could be with layer 12 or some portion of the passivation layer 17. The cleaning sequence may be performed using some combination of wet chemical agents such as acids and solvents and ionic plasma. The field plate metal stack 26 can be deposited using electron beam evaporation or sputtered using physical vapor deposition (PVD). Following the metal stack deposition, the photoresist 25 is stripped off the wafer 80 using solvents.

Figure 6:
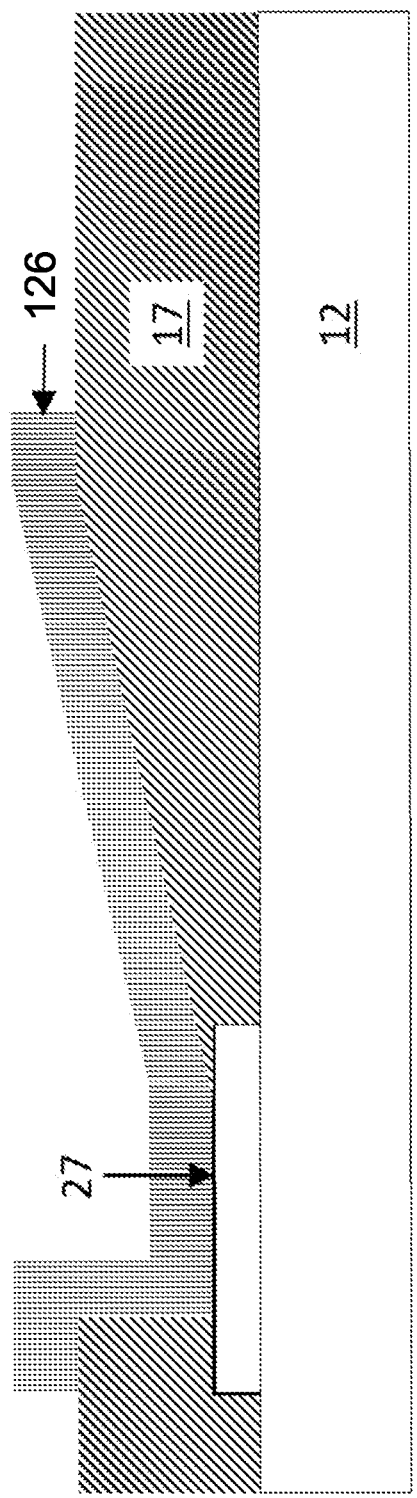
Figure 7:
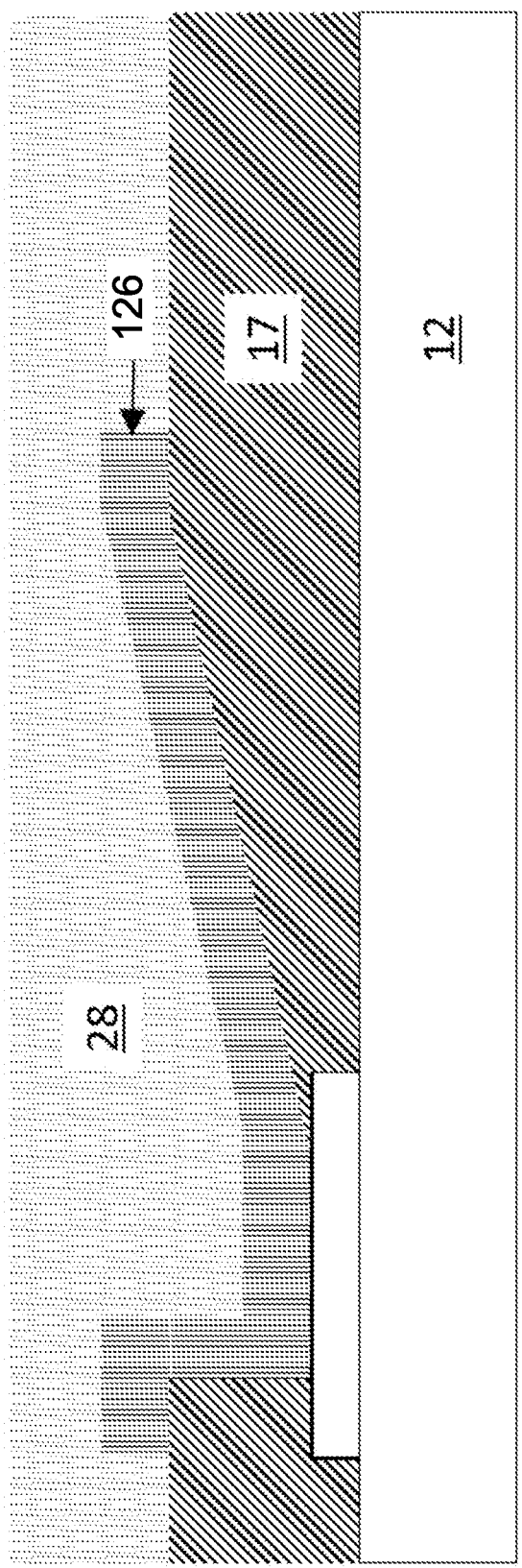

FIGS. 6-7 depict cross-sectional views after the photoresist 25 has been removed and a field plate 126 has been formed. Dielectric layer 28 may be deposited above the field plate 126. Dielectric layer 28 may include one or more insulating material, such as $Si_3N_4$, $SiO_2$, or AlN.

Figure 5B:
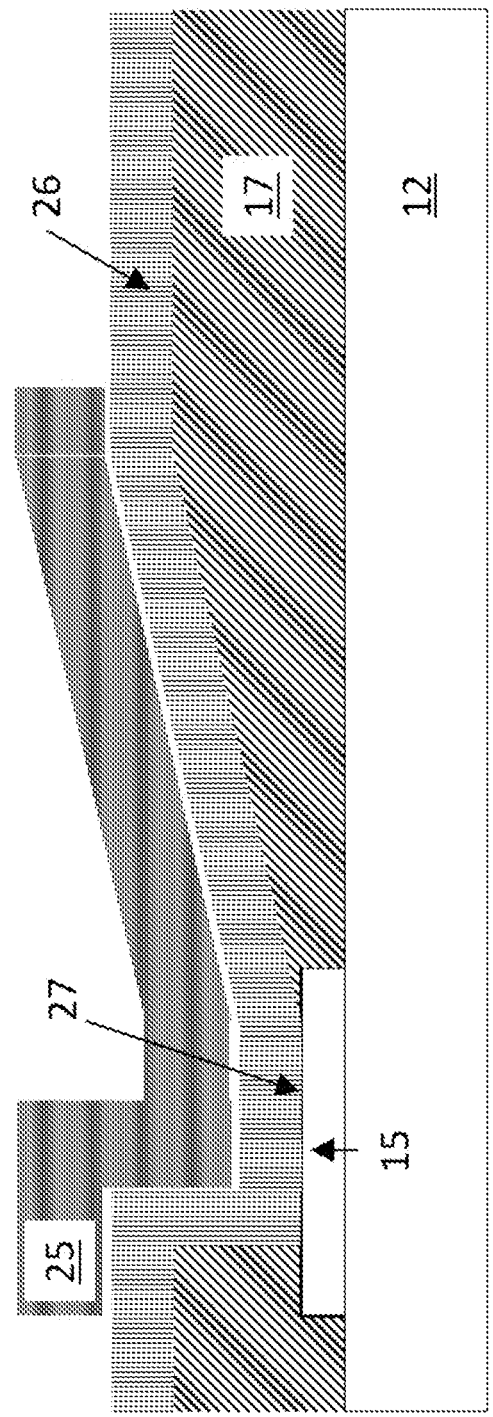

In some embodiments, instead of depositing the field plate metal stack 26 through a lift-off process, a subtractive approach can be undertaken. In the subtractive process, first the field plate metal stack 26 is blanket deposited on the wafer 80 covering passivation layer 17 and the exposed gate electrode 15 region. Following the metal stack deposition, the photoresist 25 is spin coated, exposed and developed as shown in the cross-sectional view of FIG. 5B. The wafer 80 would then be subjected to metal etch. In this case, portions of the field plate metal stack 26 that are unprotected by the photoresist 25 would be etched away using a wet etch process or a dry etch process in RIE or ICP tool.

Figure 8A:
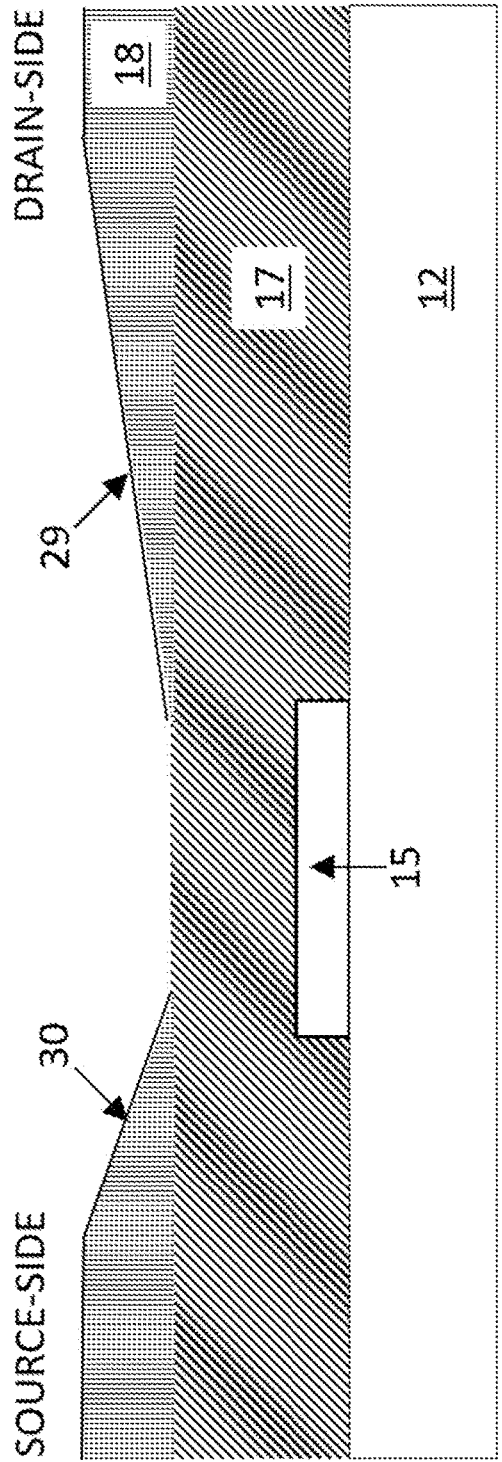
FIGS. 8A-8B depict one embodiment of process steps for forming a double-slanted gate connected field plate.

FIGS. 3A-3B provide an illustration of using greyscale lithography to create a uniform or near-uniform slanted photoresist profile 22 on one side of the clear area opening over the gate electrode 15 whereas the other side of the clear area opening over the gate electrode 15 was more abrupt. In another embodiment shown in FIG. 8A, using a greyscale mask, uniformly slanted photoresist profiles can be formed on both sides of the clear area opening over the gate electrode 15. By using an appropriate greyscale design, the left or source-side slope 30 and the right or drain-side slope 29 can be designed to be different to support different electric fields between gate-to-drain and gate-to-source regions. The slope of the source-side slope 30 may be the same as or different from the slope of the drain-side slope 29. In one example, the slope of the source-side slope 30 may be steeper (e.g., three times steeper) than the slope of the drain-side slope 29. The angle of the slant for the source-side slope 30 may be greater (e.g., four times greater) than the angle of the slant for the drain-side slope 29.

Figure 8B:
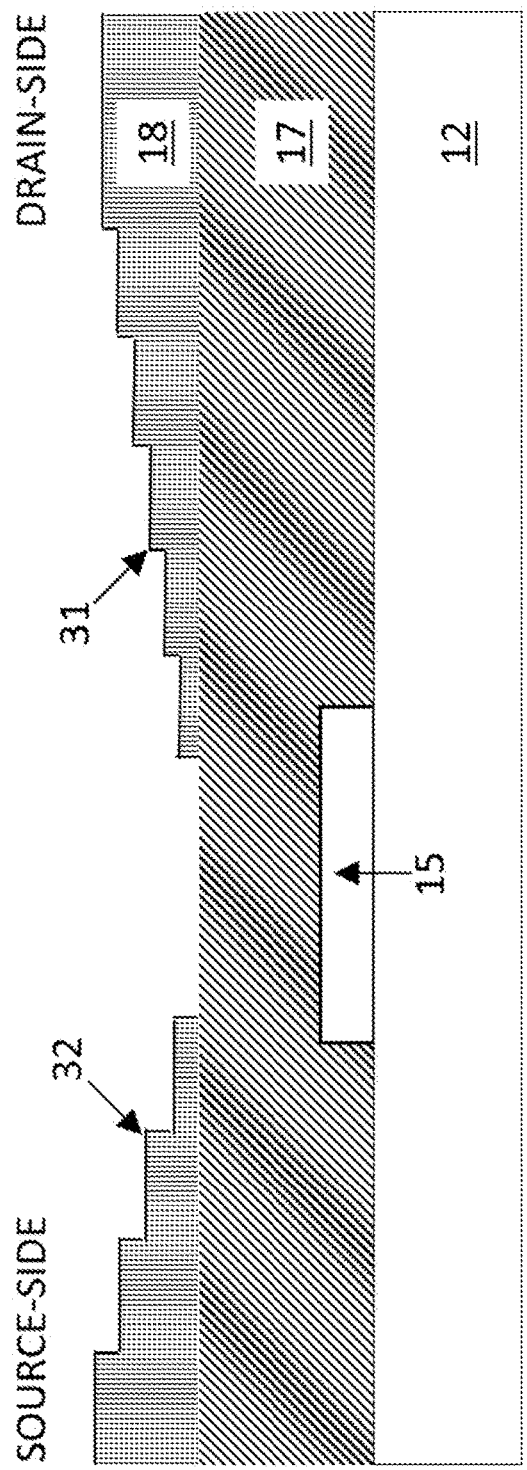

In another embodiment shown in FIG. 8B, the left or source-side staircase 32 and the right or drain-side staircase 31 can be designed to be staircase profiles instead of uniformly sloped profiles. The number of stair steps for the source-side staircase 32 may be less than the number of stair steps for the drain-side staircase 31. In one example, the number of stair steps for the source-side staircase 32 may comprise three steps and the number of stair steps for the drain-side staircase 31 may comprise five steps. In an alternative embodiment not depicted, a double-slanted gate connected field plate may comprise a source-side with uniform slope and a drain-side staircase with two or more steps. In some embodiments, a double-sided gate connected field plate comprising two different slopes, two different staircases, or a source-side slope and a drain-side staircase may be fabricated using greyscale lithography to concurrently create the different slopes and/or step profiles.

Without the use of greyscale lithography, an alternative method to creating a staircase profile for the source-side staircase 32 or the drain-side staircase 31 would require more process steps, and therefore would have higher processing cost. For example, without the use of greyscale lithography, to create two steps for the drain-side staircase 31 in passivation layer 17 would require two lithography and two etch steps; additional etch stop layers also may be required to be included in the passivation layer 17 stack.

Figure 9A:
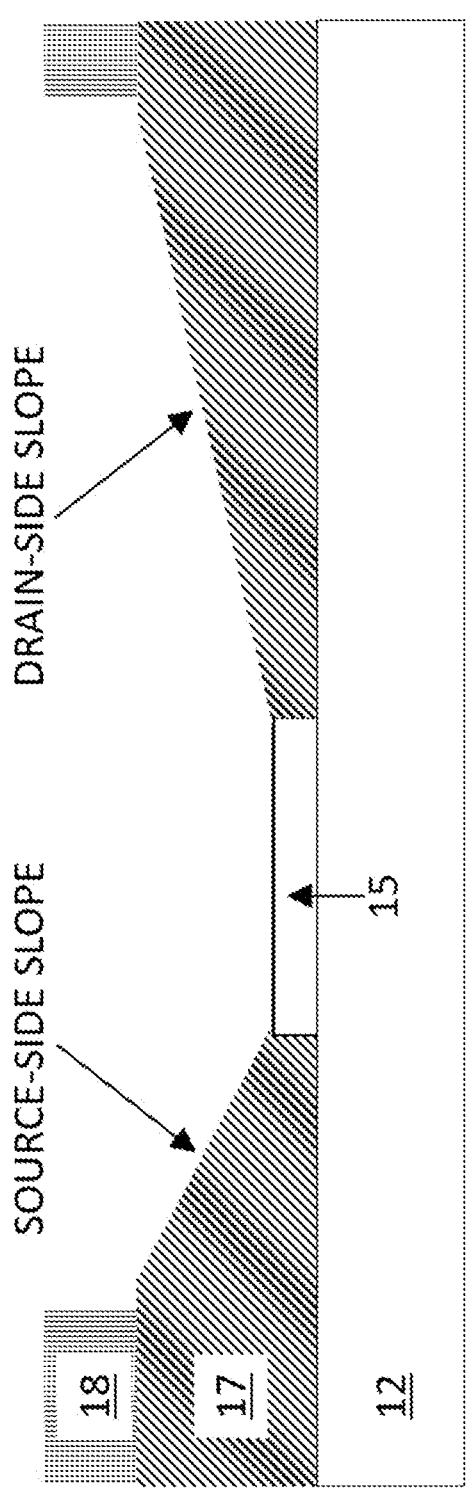
FIGS. 9A-9B depict one embodiment of process steps for forming a double-slanted gate connected field plate with a source-side slope and a drain-side slope.
Figure 9B:
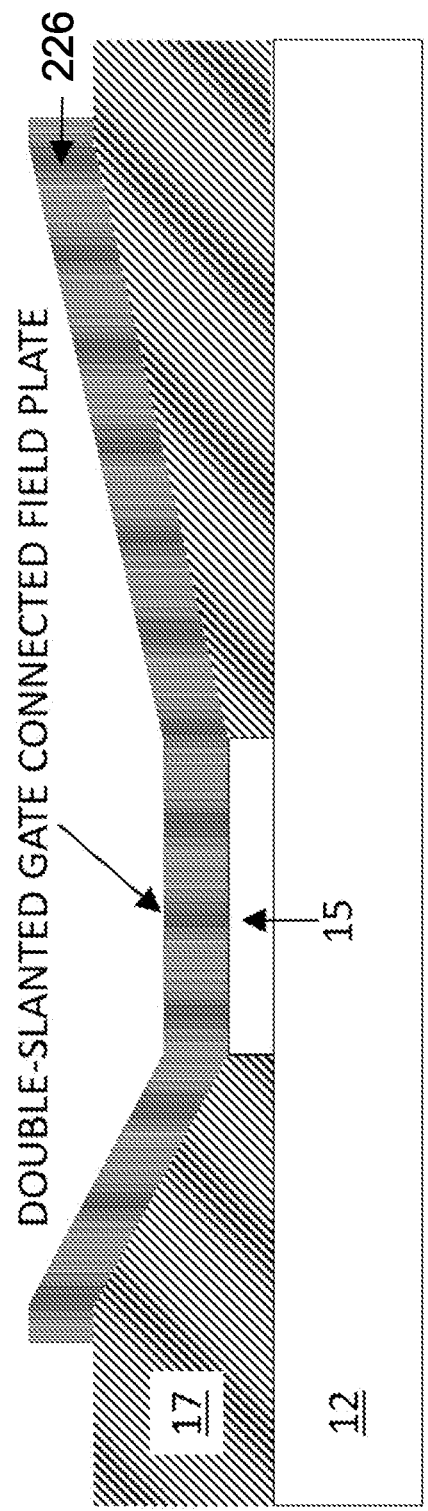

FIGS. 9A-9B depict one embodiment of process steps for forming a double-slanted gate connected field plate with a source-side slope and a drain-side slope. As depicted, a metal stack was deposited and etched over gate electrode 15 to form double-slanted gate connected field plate 226. The double-slanted gate connected field plate 226 directly connects to gate electrode 15. The double-slanted gate connected field plate 226 has a source-side slope and a drain-side slope that is different from the source-side slope.

A technical benefit of manufacturing the double-slanted gate connected field plate using greyscale lithography is that fabrication costs may be substantially reduced by reducing the number of process steps required to form the double-slanted gate connected field plate. The source-side slope and the drain-side slope of the double-slanted gate connected field plate may be concurrently formed with two different slopes or two different step profiles. As depicted in FIGS. 9A-9B, the source-side slope may be steeper than the drain-side slope. The drain-side portion of the double-slanted gate connected field plate may be longer (e.g., four times longer) than the source-side portion of the double-slanted gate connected field plate.

Figure 10A:
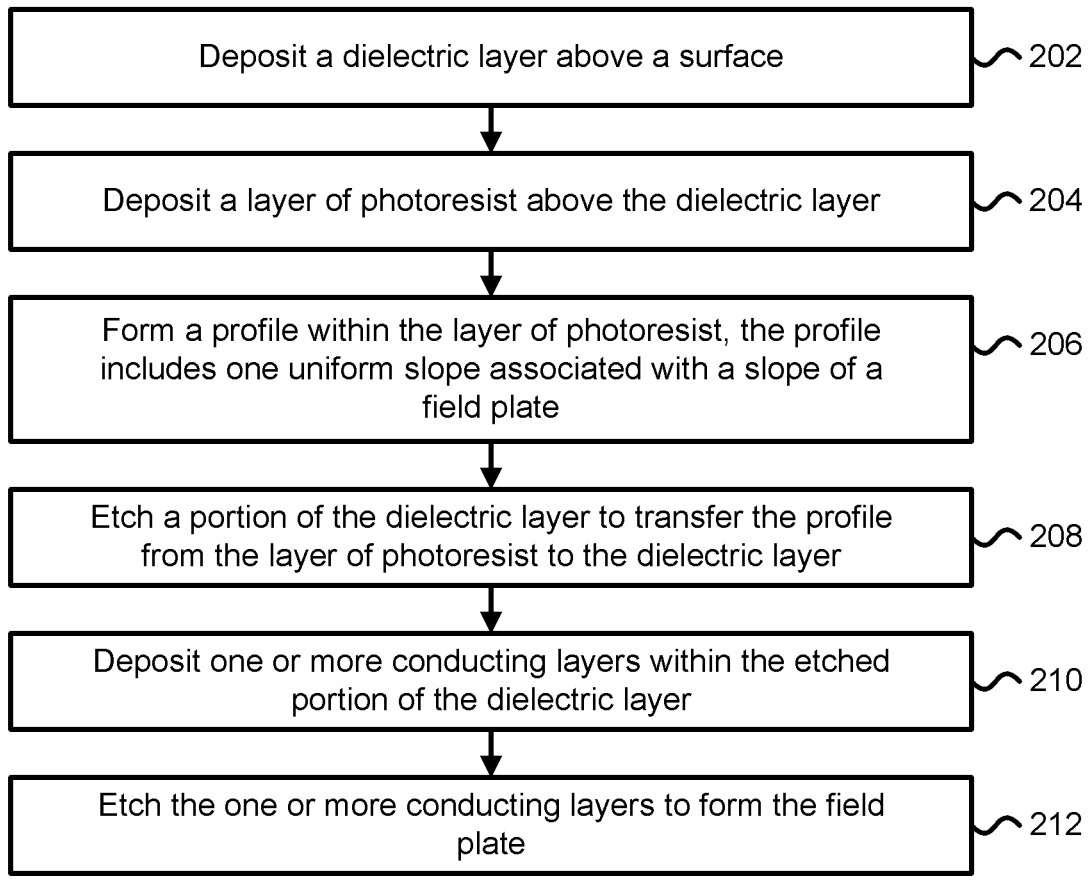
FIG. 10A depicts a flowchart describing one embodiment of a process for fabricating a field plate.

FIG. 10A depicts a flowchart describing one embodiment of a process for fabricating a field plate, such as the double-slanted gate connected field plate 226 depicted in FIG. 9B or the field plate 126 depicted in FIG. 7. The flowchart may omit common processing steps (e.g., the formation of isolation regions or structures, various implant and annealing steps, the formation of vias/contacts, the formation of a passivation layer, planarization, etc.) in order to highlight the processing steps described.

In step 202, a dielectric layer is deposited above a surface. The dielectric layer may correspond with passivation layer 17 in FIGS. 8A-8B, which may be deposited using a deposition process such as chemical vapor deposition, physical vapor deposition, or atomic layer deposition. In step 204, a layer of photoresist is deposited above the dielectric layer. The layer of photoresist may correspond with the photoresist layer 18 in FIGS. 8A-8B.

In step 206, a profile within the layer of photoresist is formed. The profile may include at least one uniform slope associated with a slope (e.g., a drain-side slope) of a field plate. The field plate may comprise a double-sided gate connected field plate. In some cases, the profile may include a first slope associated with a drain-side slope of the double-sided gate connected field plate and a second slope different from the first slope associated with a source-side slope of the double-sided gate connected field plate. In step 208, a portion of the dielectric layer is etched to transfer the profile from the layer of photoresist to the dielectric layer. In step 210, one or more conducting layers are deposited within the etched portion of the dielectric layer. In step 212, the one or more conducting layers are etched to form the field plate (e.g., to form a double-sided gate connected field plate).

Figure 10B:
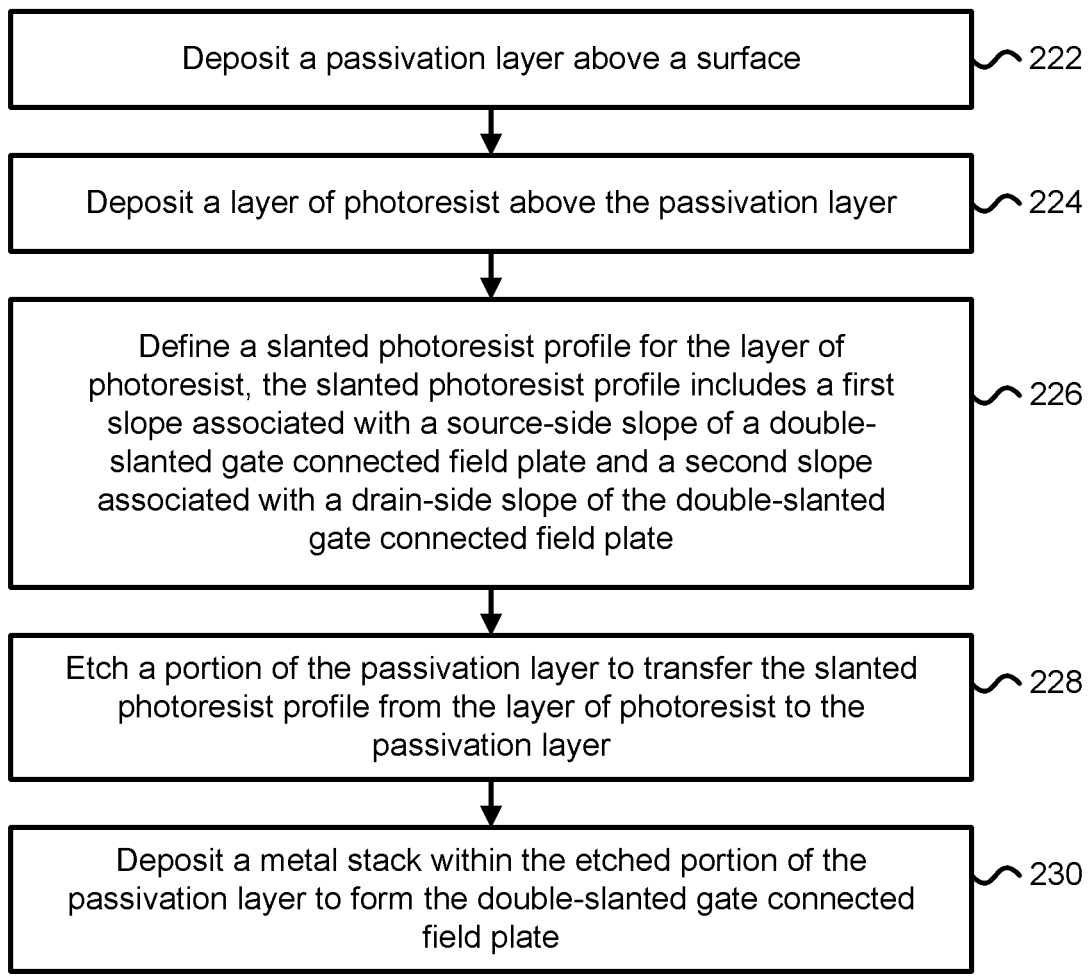
FIG. 10B depicts a flowchart describing another embodiment of a process for fabricating a field plate.

FIG. 10B depicts a flowchart describing another embodiment of a process for fabricating a field plate, such as the double-slanted gate connected field plate 226 depicted in FIG. 9B. The flowchart may omit common processing steps (e.g., the formation of isolation regions or structures, various implant and annealing steps, the formation of vias/contacts, the formation of a passivation layer, planarization, etc.) in order to highlight the processing steps described.

In step 222, a passivation layer is deposited above a surface. The passivation layer may correspond with passivation layer 17 in FIGS. 8A-8B. In step 224, a layer of photoresist is deposited above the passivation layer. In step 226, a slanted photoresist profile is defined for the layer of photoresist. The slanted photoresist profile includes a first slope associated with a source-side slope of a double-slanted gate connected field plate and a second slope associated with a drain-side slope of the double-slanted gate connected field plate. In step 228, a portion of the passivation layer is etched to transfer the slanted photoresist profile from the layer of photoresist to the passivation layer. In step 230, a metal stack within the etched portion of the passivation layer is deposited and etched to form the double-slanted gate connected field plate.

Figure 11A:
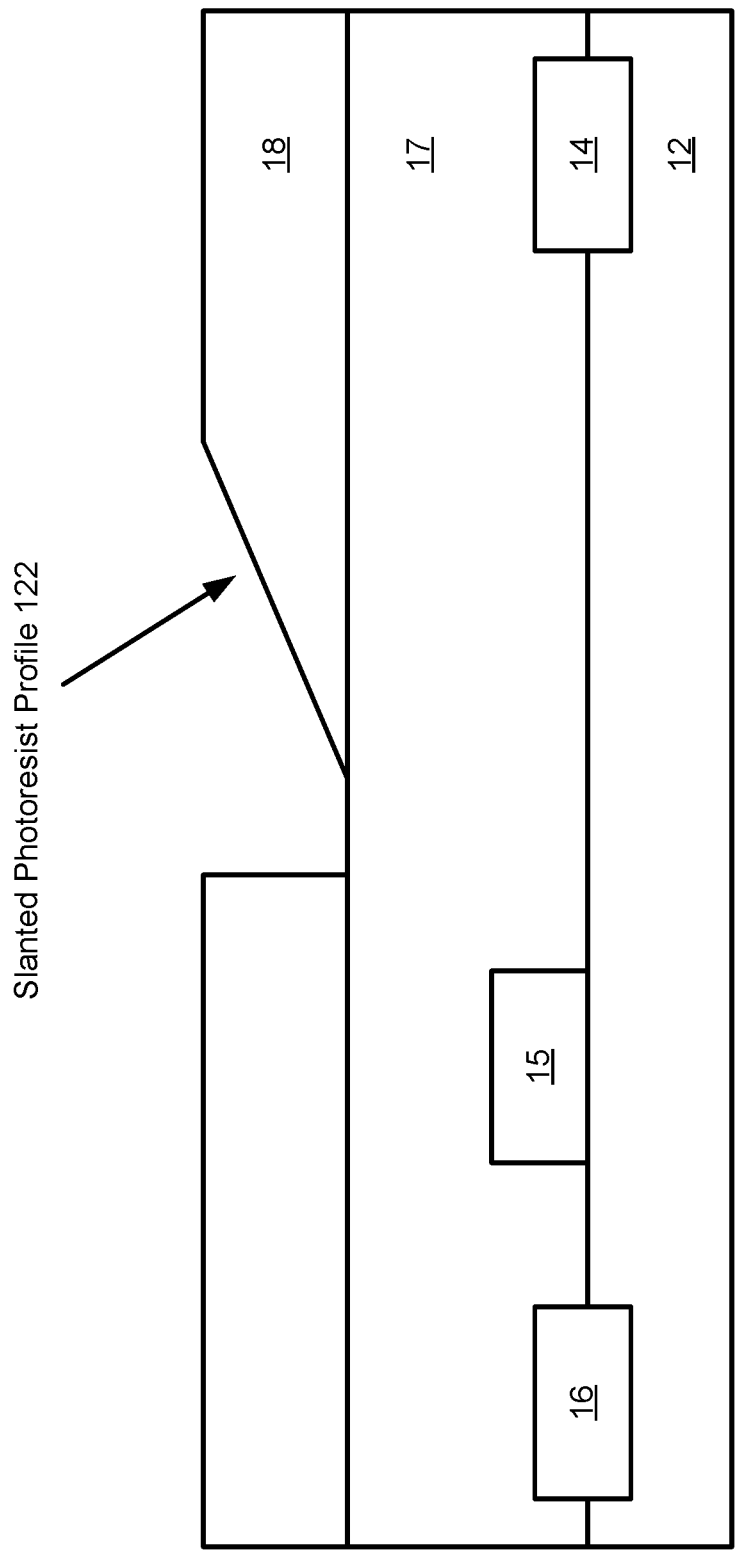
FIGS. 11A-11H depict various embodiments of cross-sectional views related to processes for fabricating one or more field plates.

FIGS. 11A-11H depict various embodiments of cross-sectional views related to processes for fabricating one or more field plates. Each field plate may have with one or more slopes. As depicted in FIG. 11A, a slanted photoresist profile 122 has been formed within the photoresist layer 18. The slanted photoresist profile 122 may correspond with a uniform slope or near-uniform slope.

Figure 11B:
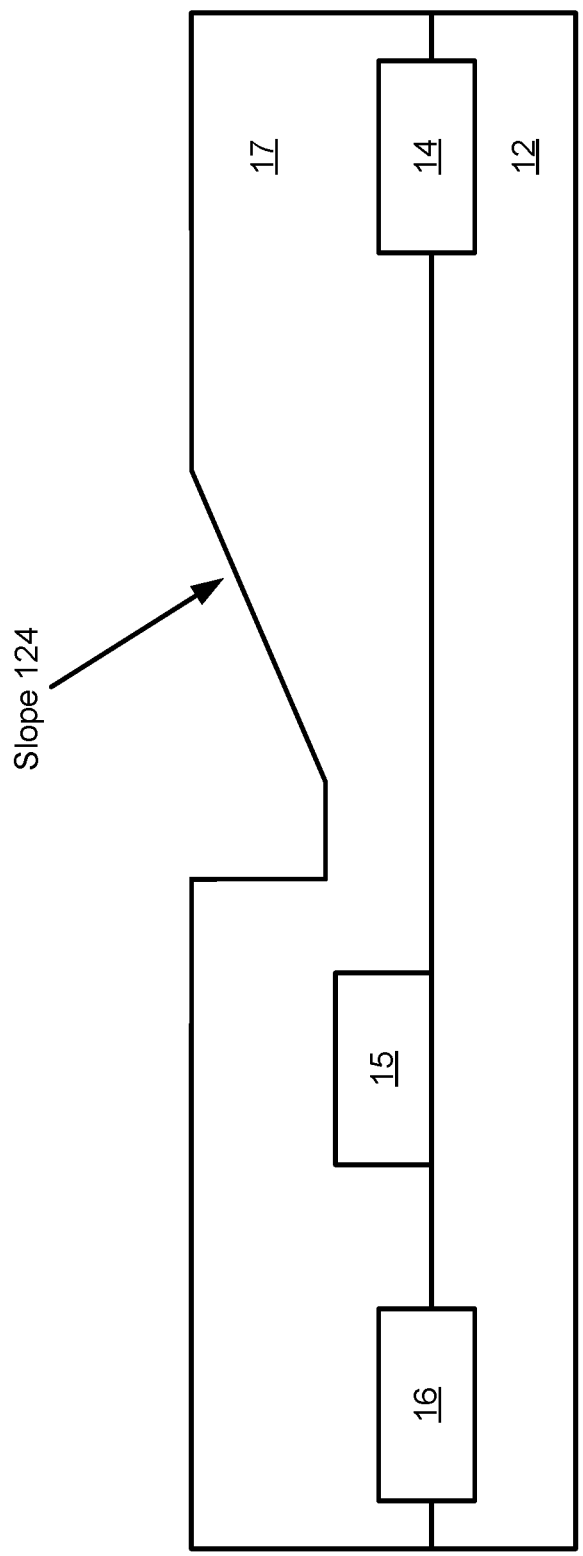

FIG. 11B depicts the transfer of the slanted photoresist profile 122 of FIG. 11A to the passivation layer 17. In some cases, the slope 124 may comprise the same slope or substantially the same slope as the slanted photoresist profile 122. The resulting slope 124 may depend on the incoming photoresist angle of the slanted photoresist profile 122 and the etch selectivity of the photoresist to the passivation layer material.

Figure 11C:
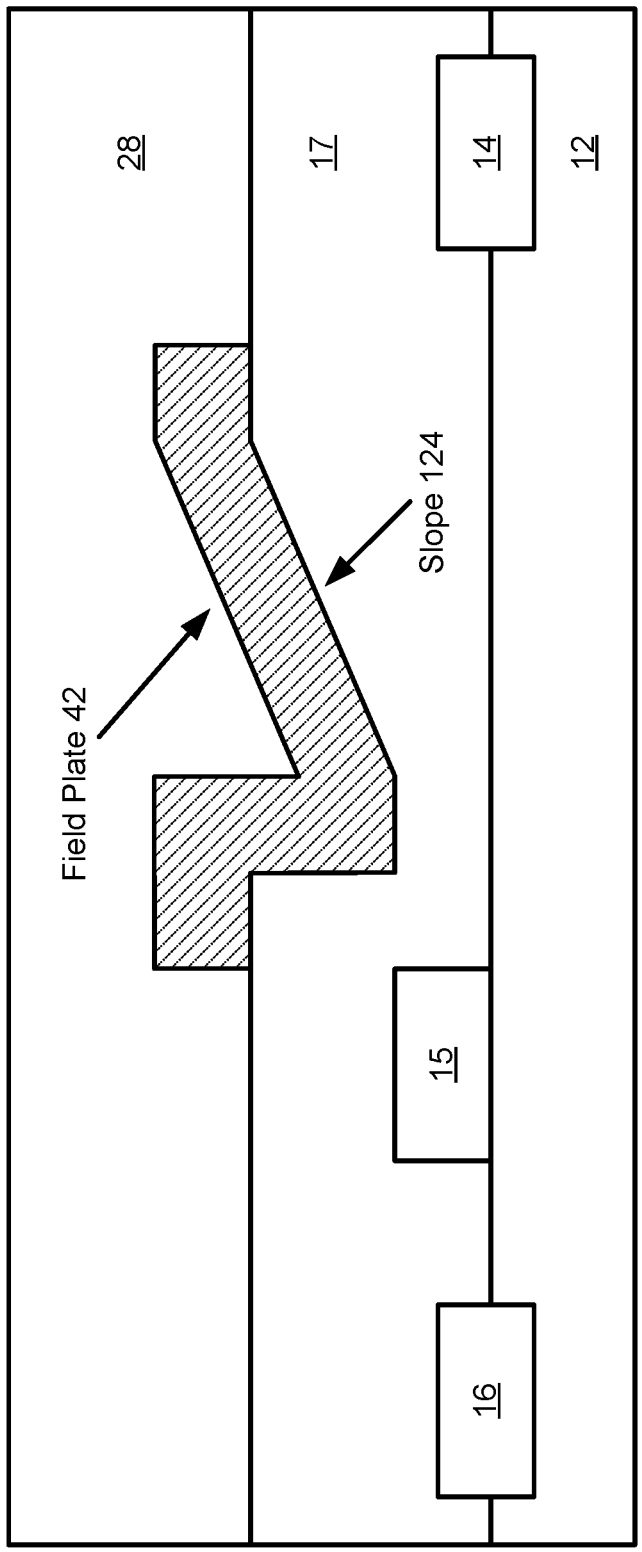

FIG. 11C depicts an embodiment of a field plate 42 with a slope 124 that extends towards the drain electrode 14 such that the thickness of the dielectric material under the field plate 42 increases as the field plate gets closer to the drain electrode 14. In one embodiment, the field plate 42 may be electrically connected to the source electrode 16. In another embodiment, the field plate 42 may be electrically connected to the gate electrode 15.

Figure 11D:
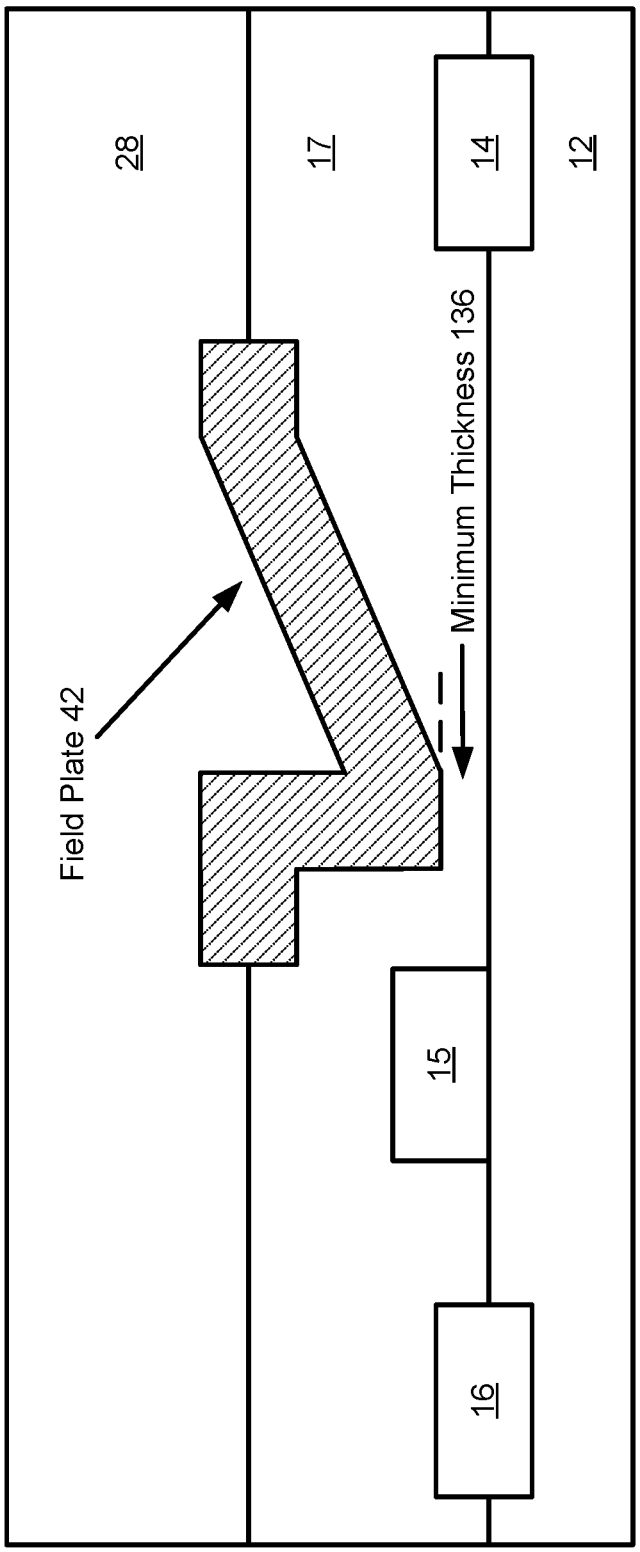

FIG. 11D depicts one embodiment of a field plate 42 in which the minimum thickness 136 of the dielectric material between the field plate 42 and the layer 12 occurs closest to the gate electrode 15 or within a minimum distance of the gate electrode 15. In some embodiments, if the field plate 42 is electrically connected to the source electrode 16, then the minimum thickness 136 may comprise a first thickness; however, if the field plate 42 is electrically connected to the gate electrode 15, then the minimum thickness 136 may comprise a second thickness. In some cases, the second thickness may be less than the first thickness. In other cases, the second thickness may be greater than the first thickness.

Figure 11E:
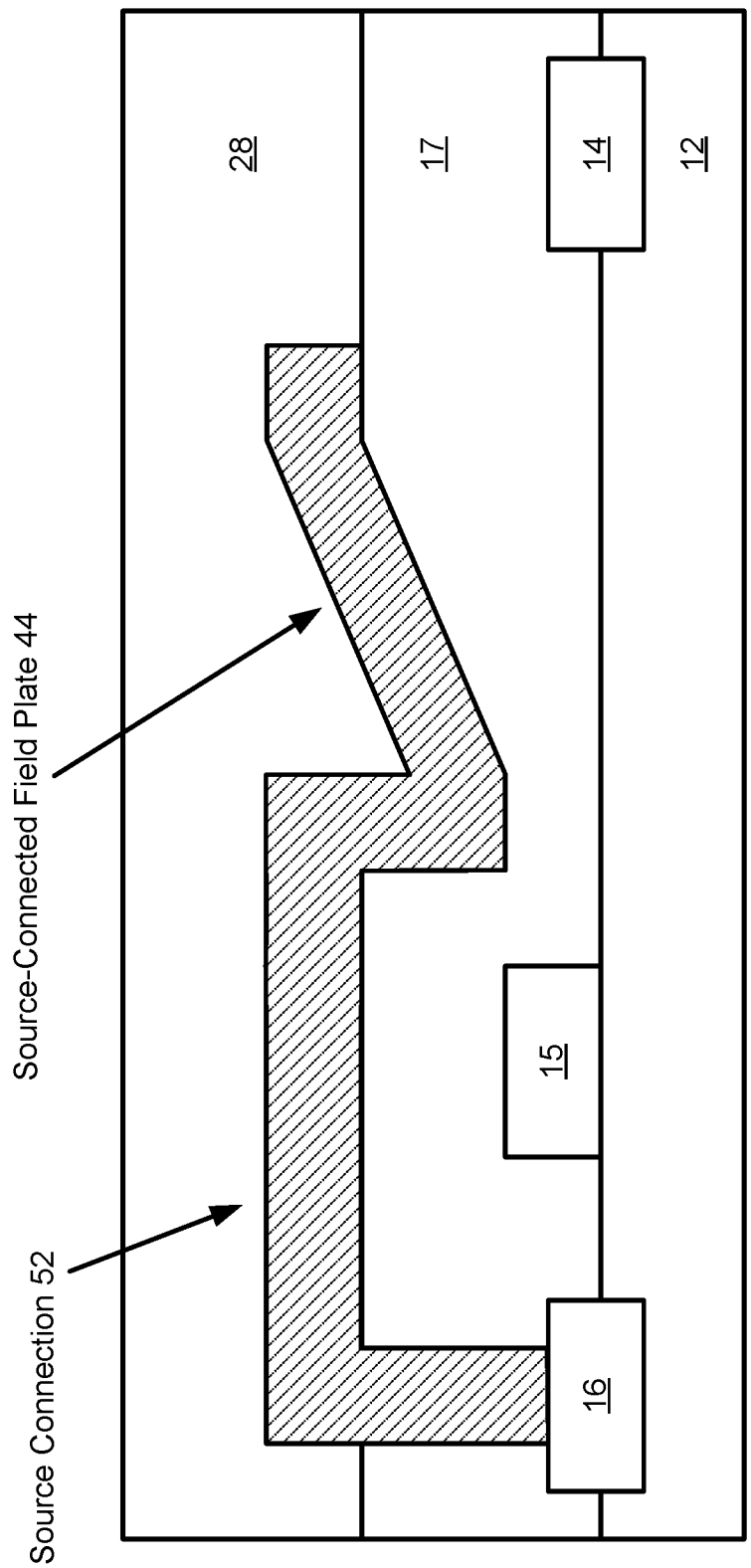

FIG. 11E depicts one embodiment of a source-connected field plate 44 that is connected to the source electrode 16 via a source connection 52. In one embodiment, the source connection 52 may comprise the same metal stack or conducting material used for the source-connected field plate 44. In some cases, the source-connected field plate 44 and its source connection 52 may be formed during the same deposition and etch steps.

Figure 11F:
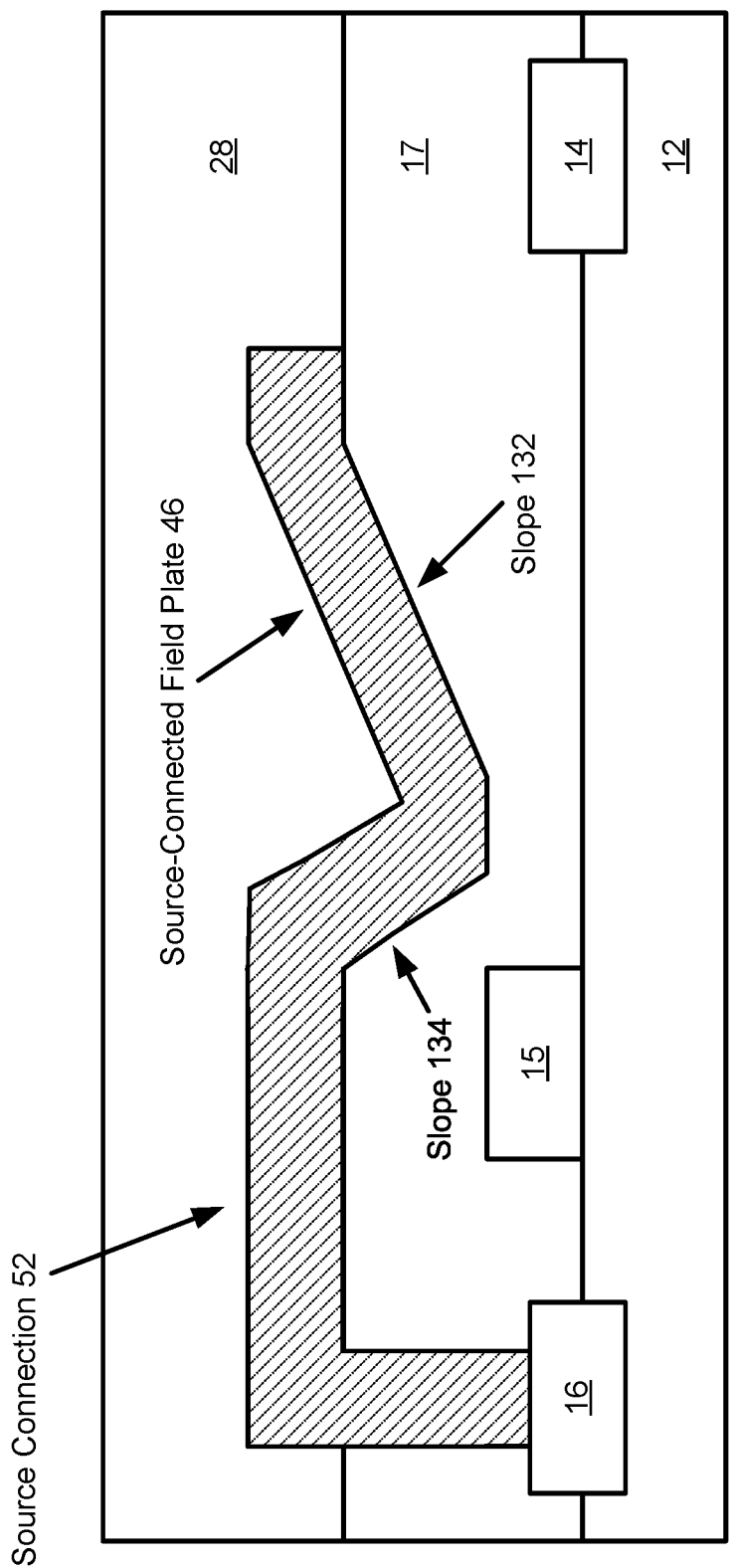

FIG. 11F depicts one embodiment of a source-connected field plate 46 that is connected to the source electrode 16 via a source connection 52. As depicted, the source-connected field plate 46 comprises a double-slanted source-connected field plate that includes a first slope 134 and a second slope 132. The slope 134 may be different from the slope 132. In one example, the slope 134 is steeper than the slope 132. As the location of the minimum thickness of the dielectric material between the source-connected field plate 46 and the layer 12 may occur closer to the gate electrode 15 than the drain electrode 14, the slope 134 may be steeper than the slope 132.

Figure 11G:
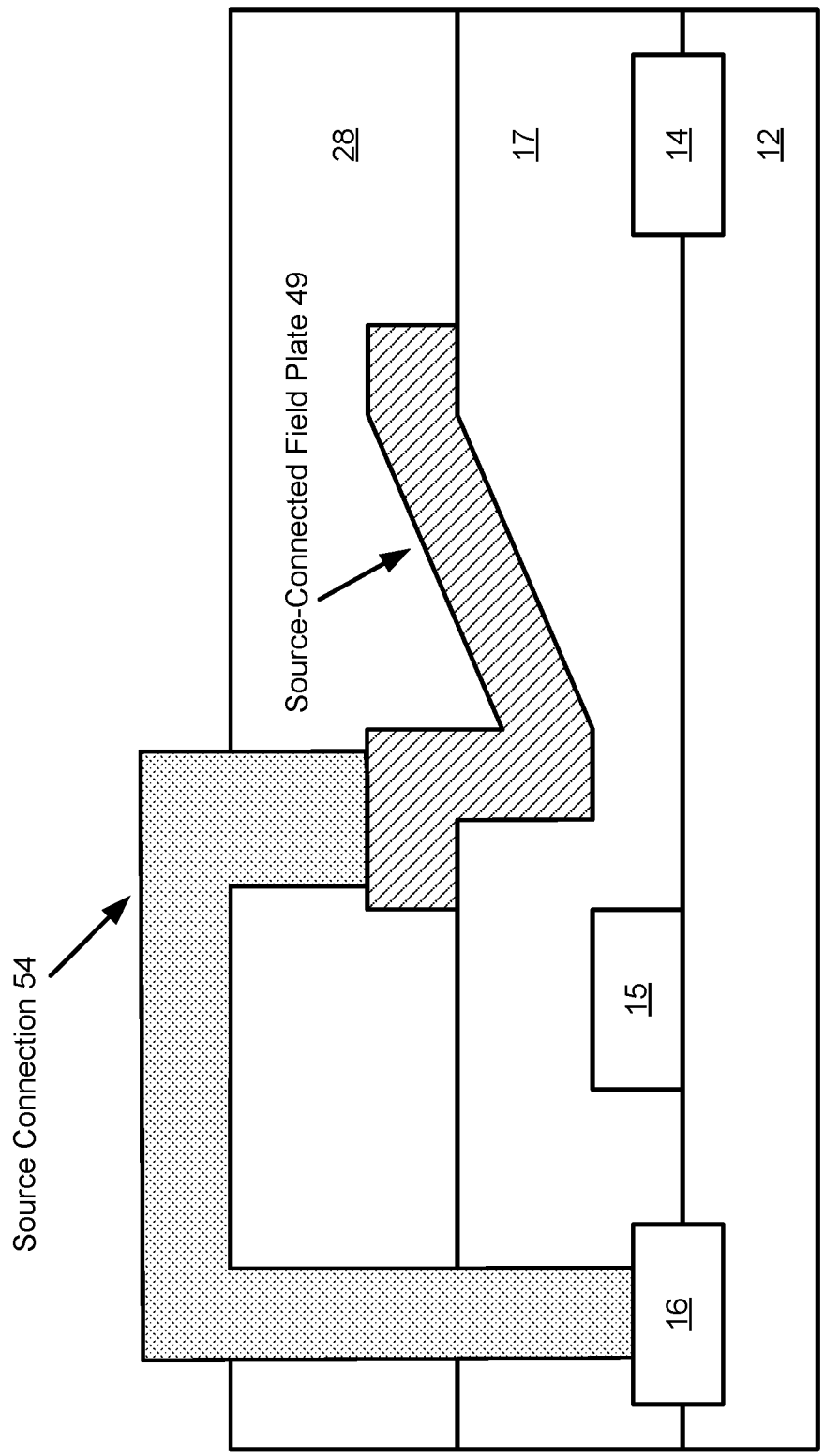

FIG. 11G depicts one embodiment of a source-connected field plate 49 that is connected to the source electrode 16 via a source connection 54. In one embodiment, the source connection 54 may comprise a different conducting material than that used for the source-connected field plate 49.

Figure 11H:
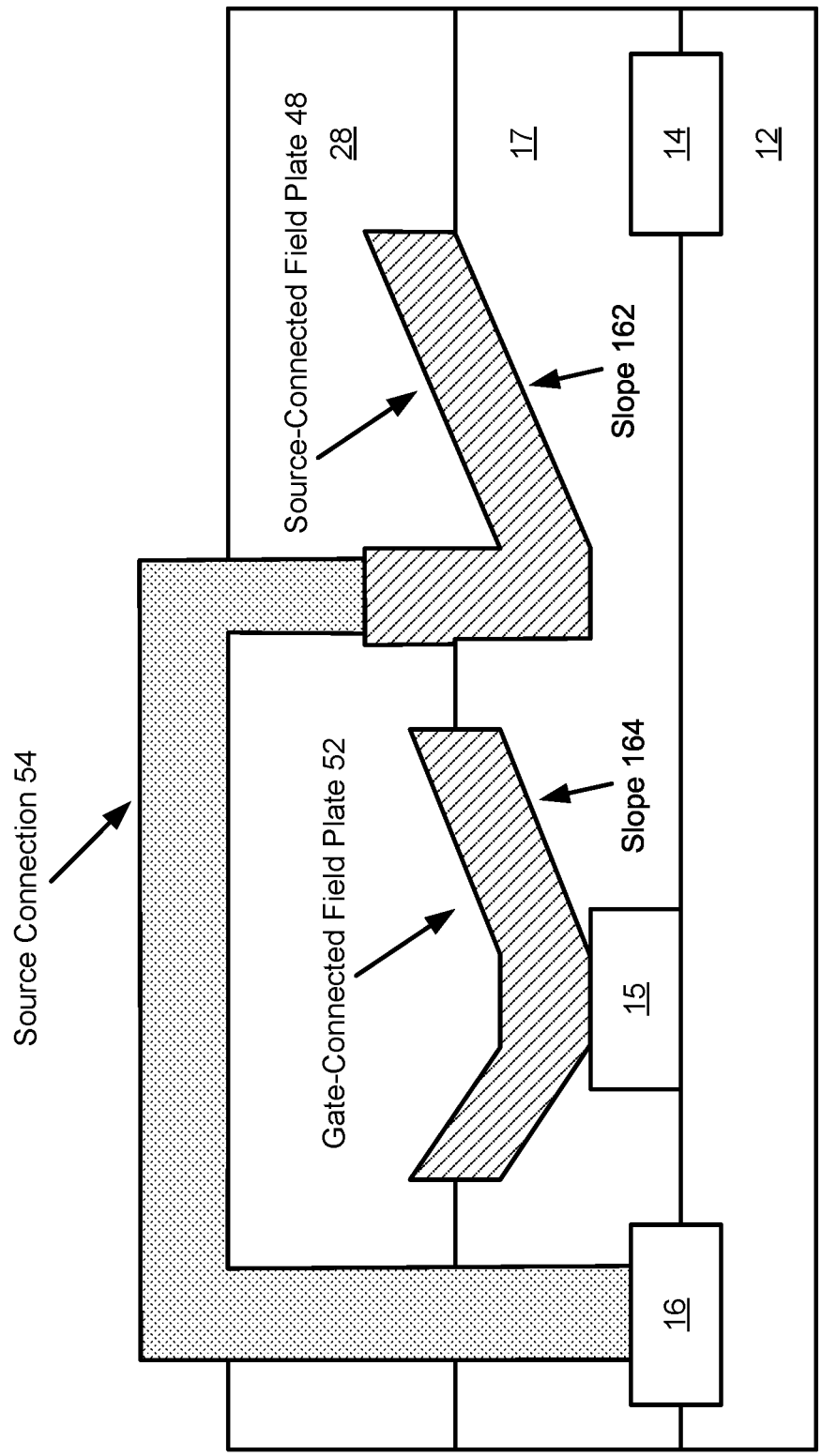

FIG. 11H depicts one embodiment of a transistor structure that includes a gate-connected field plate 52 and a source-connected field plate 48. One technical benefit of using both a gate-connected field plate and a source-connected field plate is that a wider range of voltages may be utilized during transistor operation. The gate-connected field plate 52 directly connects to the gate electrode 15 and has a first slope 164. The first slope 164 has an increasing slope profile that extends in the direction of the drain electrode 14 such that the thickness of the dielectric material under the gate-connected field plate 52 increases as the field plate gets closer to the drain electrode 14. Source-connected field plate 48 connects to the source electrode 16 via the source connection 54. The source-connected field plate 48 has a second slope 162. The second slope 162 has an increasing slope profile that extends in the direction of the drain electrode 14 such that the thickness of the dielectric material under the source-connected field plate 48 increases as the field plate gets closer to the drain electrode 14. In one embodiment, the first slope 164 may be less steep than the second slope 162. In another embodiment, the first slope 164 may be the same slope as the second slope 162. In another embodiment, the first slope 164 may be steeper than the second slope 162.

Figure 12:
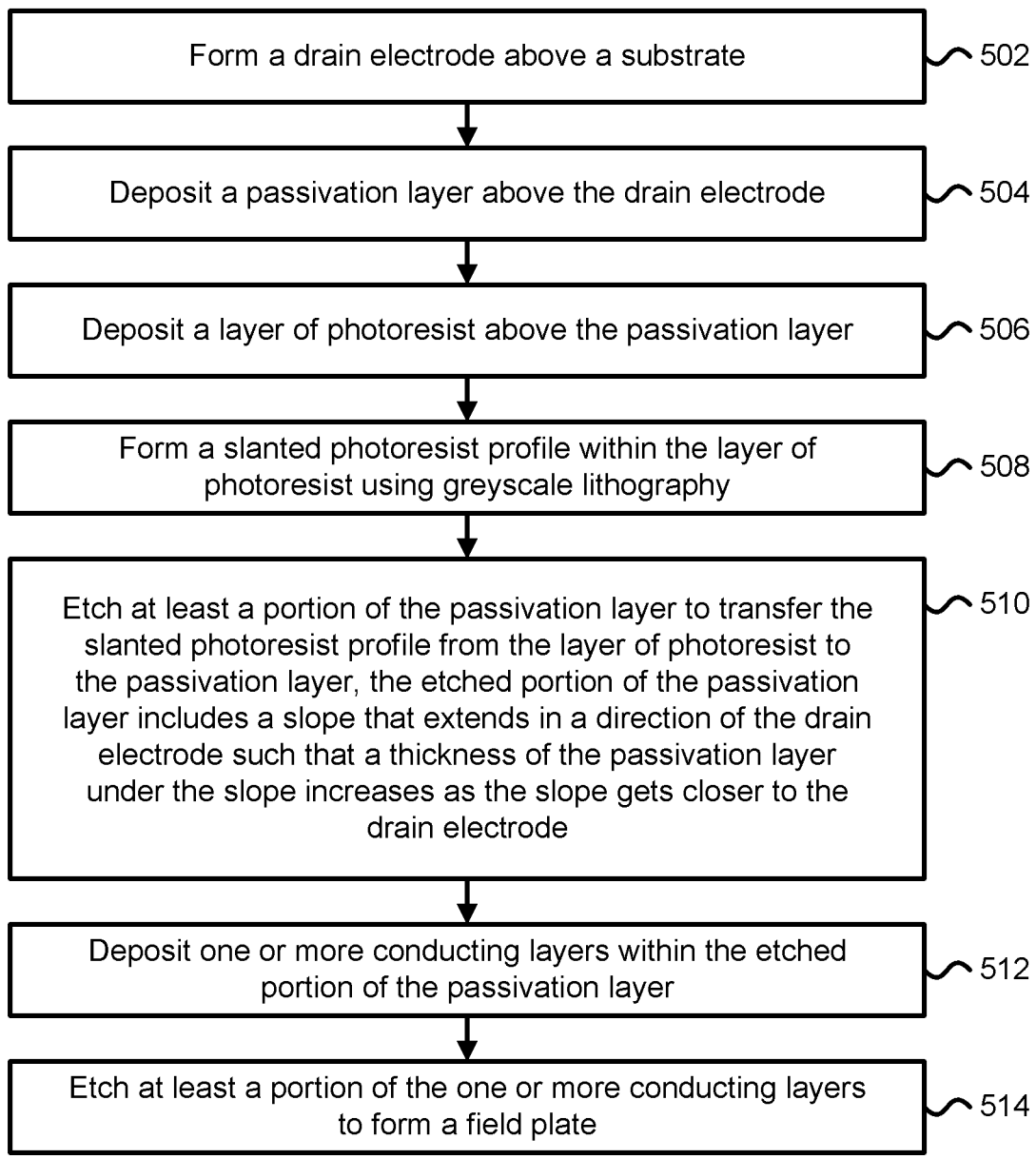
FIG. 12 depicts a flowchart describing one embodiment of a process for fabricating a field plate.

FIG. 12 depicts a flowchart describing one embodiment of a process for fabricating a field plate, such as the double-slanted gate connected field plate 42 depicted in FIG. 11C. The flowchart may omit common processing steps (e.g., the formation of isolation regions or structures, various implant and annealing steps, the formation of vias/contacts, the formation of a passivation layer, planarization, etc.) in order to highlight the processing steps described.

In step 502, a drain electrode is formed above a substrate. The drain electrode may correspond with a drain terminal of a HEMT device and may be formed via deposition and etch of a drain electrode material. The drain electrode may include one or more layers of titanium, aluminum, and/or gold. For example, the drain electrode may comprise a metal stack, such a Ti/Al/Ni/Au metal stack or a Ti/Al/Ti/TiN metal stack. In step 504, a passivation layer is deposited above the drain electrode. In step 506, a layer of photoresist is deposited above the passivation layer. In some cases, the drain electrode may correspond with the drain electrode 14 in FIG. 11A, the passivation layer may correspond with the passivation layer 17 in FIG. 11A, and the layer of photoresist may correspond with the photoresist layer 18 in FIG. 11A. In step 508, a slanted photoresist profile is formed within the layer of photoresist using grayscale lithography. The slanted photoresist profile may correspond with the slanted photoresist profile 122 in FIG. 11A.

In step 510, at least a portion of the passivation layer is etched to transfer the slanted photoresist profile from the layer of photoresist to the passivation layer. The etched portion of the passivation layer may include a slope that extends in a direction of the drain electrode such that a thickness of the passivation layer under the slope increases as a slope gets closer to the drain electrode. The slope may comprise a positive slope. In step 512, one or more conducting layers are deposited within the etched portion of the passivation layer. In step 514, at least a portion of the one or more conducting layers are etched to form a field plate.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
forming a drain electrode above a substrate;
depositing a passivation layer above the drain electrode;
depositing a layer of photoresist above the passivation layer;
forming a slanted photoresist profile within the layer of photoresist using greyscale lithography;
etching at least a portion of the passivation layer to transfer the slanted photoresist profile from the layer of photoresist to the passivation layer, the etched portion of the passivation layer includes a slope that extends in a direction of the drain electrode such that a thickness of the passivation layer under the slope increases as the slope gets closer to the drain electrode;

depositing one or more conducting layers above the etched portion of the passivation layer; and etching at least a portion of the one or more conducting layers, the etching the at least the portion of the one or more conducting layers includes etching the one or more conducting layers to concurrently form a source-connected field plate and a gate-connected field plate.

2. The method of claim 1, wherein:

the etching the at least the portion of the passivation layer to transfer the slanted photoresist profile from the layer of photoresist to the passivation layer includes performing reactive-ion etching to transfer the slanted photoresist profile from the layer of photoresist to the passivation layer.

3. The method of claim 1, further comprising:

forming a source electrode above the substrate; and forming a source connection connecting the source electrode to the source-connected field plate.

4. The method of claim 1, further comprising:

forming a gate electrode above the substrate; and the depositing the one or more conducting layers above the etched portion of the passivation layer includes depositing the one or more conducting layers over the gate electrode.

5. A method for fabricating field plate structures, comprising:

forming a source electrode;

depositing a dielectric layer above an electrode;

depositing a layer of photoresist above the dielectric layer;

forming a profile within the layer of photoresist using greyscale lithography, the profile includes a first slope associated with a field plate;

etching a portion of the dielectric layer to transfer the profile from the layer of photoresist to the dielectric layer, the etched portion of the dielectric layer includes a slope corresponding to the first slope that extends in a direction of the electrode such that a thickness of the dielectric layer under the slope increases as the slope gets closer to the electrode;

depositing one or more conducting layers above the etched portion of the dielectric layer;

etching the one or more conducting layers to form the field plate; and forming a source connection connecting the source electrode to the field plate, a portion of the source connection is formed on a different insulating layer from the field plate.

6. The method of claim 5, further comprising:

forming a gate electrode; and the depositing the one or more conducting layers above the etched portion of the dielectric layer includes depositing the one or more conducting layers over the gate electrode.

7. The method of claim 5, wherein:

the electrode comprises a drain electrode.

8. The method of claim 5, wherein:

the forming the profile includes exposing the layer of photoresist to light and then removing a portion of the layer of photoresist to form the profile.

9. A method for fabricating a field plate, comprising:

forming an electrode above a surface;

forming a source electrode above the surface;

depositing a dielectric layer above the electrode;

depositing a layer of photoresist above the dielectric layer;

forming a profile within the layer of photoresist using greyscale lithography, the profile includes a first slope associated with the field plate;

etching a portion of the dielectric layer to transfer the profile from the layer of photoresist to the dielectric layer, the etched portion of the dielectric layer includes a slope corresponding to the first slope that extends in a direction of the electrode such that a thickness of the dielectric layer under the slope increases as the slope gets closer to the electrode;

depositing one or more conducting layers above the etched portion of the dielectric layer to form the field plate; and forming a source connection connecting the source electrode to the field plate, a portion of the source connection is formed on a different insulating layer from the field plate.

10. The method of claim 9, further comprising:

forming a gate electrode above the surface; and the depositing the one or more conducting layers above the etched portion of the dielectric layer includes depositing the one or more conducting layers over the gate electrode.

11. The method of claim 9, wherein:

the electrode comprises a drain electrode.

* * * * *